United States Patent
Scheible et al.

(10) Patent No.: US 10,892,752 B2
(45) Date of Patent: Jan. 12, 2021

(54) SENSOR SYSTEM FOR PROTECTING MOVABLE OBJECTS AND METHOD FOR OPERATING A SENSOR SYSTEM

(71) Applicants: Martin Scheible, Blaubeuren (DE); Markus Werner, Neu-Ulm (DE); Thomas Wiest, Ochsenhausen (DE)

(72) Inventors: Martin Scheible, Blaubeuren (DE); Markus Werner, Neu-Ulm (DE); Thomas Wiest, Ochsenhausen (DE)

(73) Assignee: MAYSER GMBH & CO. KG, Ulm (DE)

(*) Notice: Subject to any disclaimer, the term of this patent is extended or adjusted under 35 U.S.C. 154(b) by 224 days.

(21) Appl. No.: 16/019,759

(22) Filed: Jun. 27, 2018

(65) Prior Publication Data
US 2019/0013808 A1    Jan. 10, 2019

(30) Foreign Application Priority Data
Jul. 3, 2017 (DE) .......................... 10 2017 211 284

(51) Int. Cl.
*H03K 17/955* (2006.01)
(52) U.S. Cl.
CPC .................................. *H03K 17/955* (2013.01)
(58) Field of Classification Search
CPC combination set(s) only.
See application file for complete search history.

(56) References Cited

U.S. PATENT DOCUMENTS

| 8,334,623 | B2 | 12/2012 | Reime | |
| 2002/0179822 | A1* | 12/2002 | Breed | B60J 7/0573 |
| | | | | 250/221 |
| 2006/0125492 | A1* | 6/2006 | Andarawis | G01D 5/24 |
| | | | | 324/667 |
| 2013/0057404 | A1* | 3/2013 | Thibault | G08B 29/22 |
| | | | | 340/545.1 |
| 2018/0238096 | A1* | 8/2018 | Liberda | E05F 15/46 |

(Continued)

FOREIGN PATENT DOCUMENTS

| DE | 101 31 243 C1 | 11/2002 |
| DE | 103 23 030 A1 | 12/2004 |

(Continued)

OTHER PUBLICATIONS

Office Action of German Patent Office issued in German Application No. 10 2017 211 284.0 dated Apr. 27, 2018 (9 pages).

*Primary Examiner* — Jared Fureman
*Assistant Examiner* — Emmanuel Dominique
(74) *Attorney, Agent, or Firm* — Flynn Thiel, P.C.

(57) ABSTRACT

A sensor system for protecting movable objects, in particular motor-driven doors or flaps, having at least one capacitive sensor and having at least one control unit. The control unit is designed to generate a transmission signal for the capacitive sensor and to evaluate a first reception signal therefrom. At least one further electrode is provided, wherein the capacitive sensor and the further electrode are movable relative to one another. The control unit has an evaluation arrangement which evaluates a second reception signal from the further electrode, and the evaluation arrangement is designed to derive an item of information relating to the distance between the capacitive sensor and the further electrode from the second reception signal.

21 Claims, 6 Drawing Sheets

(56) References Cited

U.S. PATENT DOCUMENTS

Figure 1:
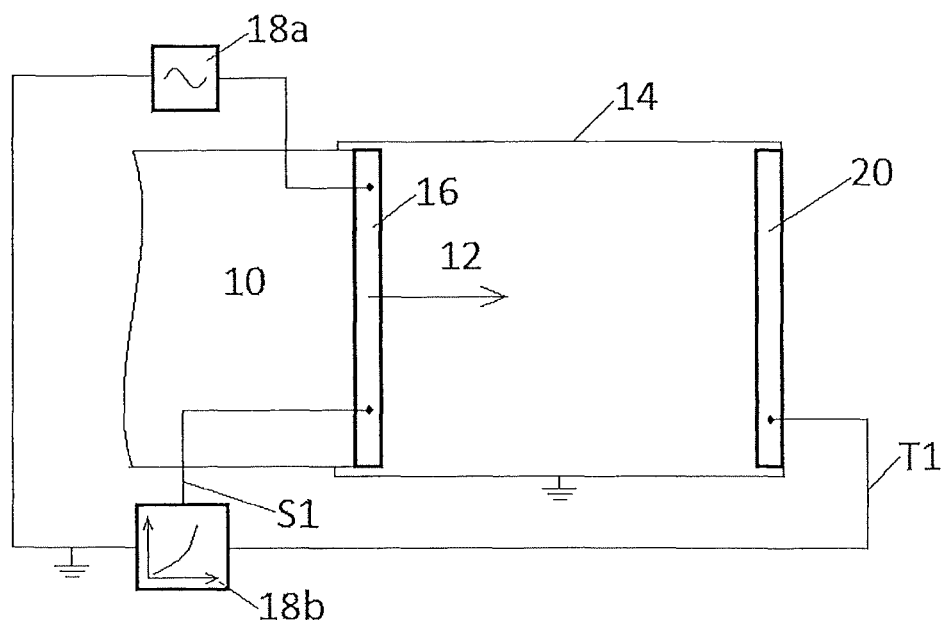

2019/0292838 A1* 9/2019 Tokudome .............. E05F 15/40
2020/0241135 A1* 7/2020 Litvak .................... G08C 23/04

FOREIGN PATENT DOCUMENTS

| DE | 10 2008 005 783 A1 | 7/2009 |
| DE | 10 2016 109 800 B3 | 6/2017 |
| JP | 2008144518 A * | 6/2008 |

* cited by examiner

SENSOR SYSTEM FOR PROTECTING MOVABLE OBJECTS AND METHOD FOR OPERATING A SENSOR SYSTEM

The invention relates to a sensor system for protecting movable objects, in particular motor-driven doors or flaps, having at least one capacitive sensor and having at least one control unit, wherein the control unit is designed to generate a transmission signal for the at least one capacitive sensor and to evaluate a first reception signal from the at least one capacitive sensor. The invention also relates to a method for operating a sensor system according to the invention.

The invention is intended to improve a sensor system and a method for operating a sensor system for protecting movable objects with at least one capacitive sensor.

According to the invention, a sensor system having the features of Claim 1 and a method for operating a sensor system having the features of Claim 10 are provided for this purpose. Advantageous developments of the invention are stated in the subclaims.

A sensor system for protecting movable objects, in particular motor-driven doors or flaps, has at least one capacitive sensor and at least one control unit. The control unit is designed to generate a transmission signal for the at least one capacitive sensor and to evaluate a first reception signal from the at least one capacitive sensor. At least one further electrode which is separate from the sensor is provided, wherein the at least one capacitive sensor and the at least one further electrode are movable relative to one another. Means for generating a transmission signal for the at least one further electrode are provided. Alternatively or additionally, means for evaluating a second reception signal from the at least one further electrode are provided. The control unit can have the means for evaluating a second reception signal from the at least one further electrode. The evaluation means are designed to derive an item of information relating to the distance between the at least one capacitive sensor and the further electrode from the second reception signal.

Providing the further electrode and evaluating the second reception signal from the at least one further electrode provide an item of information relating to the distance between the capacitive sensor and the further electrode. This distance information can be used to improve the capacitive detection of objects. Specifically, the reception signal from a capacitive sensor changes if the latter is brought closer to a mass or if the mass is brought closer to the sensor. The reception signal from a capacitive sensor mounted on the tailgate of a motor vehicle, for example, thus changes, even without the presence of an object, solely as a result of the tailgate being closed. If an item of distance information is now additionally available and the further electrode is arranged, for example, in a stationary manner on the vehicle with respect to the capacitive sensor on the tailgate, the change in the reception signal from the capacitive sensor during closing of the tailgate can be compensated for by means of the distance information or else taken into account in another manner. This makes it possible to distinguish in a considerably more reliable manner between a change in the reception signal from the capacitive sensor as a result of the change in the distance between the capacitive sensor and the mass solely as a result of the tailgate being closed and a signal change caused by the presence of an object in the closing gap between the tailgate and the vehicle. As a result, the invention makes it possible to considerably improve the capacitive capture of objects in a surprisingly simple manner, in particular when protecting motor-driven doors or flaps, for example tailgates, vehicle doors, sliding doors, sliding roofs, machine enclosures with flaps and the like. The sensor system according to the invention can also be used, for example, to protect robot arms, for example in order to detect movable objects, for example people, in the movement area of a robot arm.

In one development of the invention, the control unit is designed to calculate a differential signal, wherein the differential signal is formed from the possibly weighted reception signal from the at least one capacitive sensor and the possibly weighted reception signal from the at least one further electrode.

Such a differential signal is substantially independent of the distance between the sensor and the further electrode. If the sensor is fitted, for example, to the closing edge of a door or flap and the further electrode is fitted to a housing, for example a vehicle body, opposite the sensor in the closing direction, the differential signal is substantially independent of the relative position of the door and the body and, as a result, can be used to detect an object in a very simple manner. In contrast, the reception signals from the capacitive sensor alone and the reception signal from the further electrode provide an item of information relating to the distance between the sensor and the further electrode and therefore also relating to the closing state of the door or flap.

In one development of the invention, the at least one reception electrode forms part of a further capacitive sensor.

In this manner, if two capacitive sensors which are movable relative to one another are used, it is possible to obtain an item of distance information by, for example only occasionally, using the reception signal from the second capacitive sensor for an item of information relating to the distance between the two capacitive sensors.

In one development of the invention, at least two capacitive sensors are provided, and the control unit is designed to apply a transmission signal to the capacitive sensors in temporal succession.

This makes it possible to alternately use the two capacitive sensors as sensors and as a further electrode. For example, a capacitive sensor emits a transmission signal in a first interval of time and the reception signal from this capacitive sensor is then used to detect objects. In contrast, a transmission signal is not applied to the second capacitive sensor in the first interval of time and the second capacitive sensor operates as a further electrode. The reception signal from the second capacitive sensor can then be used to determine a distance between the two capacitive sensors.

In one development of the invention, at least two capacitive sensors are provided, wherein the control unit is designed to generate a transmission signal at a different frequency for each capacitive sensor.

This makes it possible to operate the capacitive sensors at the same time, wherein a transmission signal at a first frequency is applied to the first capacitive sensor and the second capacitive sensor is used to determine a distance between the two capacitive sensors at the first frequency. In contrast, a transmission signal at a second frequency is applied to the second capacitive sensor and the second capacitive sensor operates as a sensor for detecting objects at the second frequency. In contrast, the first capacitive sensor operates as a further electrode for determining a distance between the two capacitive sensors at the second frequency. As a result, both the detection of objects and the determination of a distance between the two capacitive sensors are carried out at the same time by both sensors. This makes it possible to considerably improve both the detection of objects and the determination of a distance between the two capacitive sensors.

In one development of the invention, the control unit has a memory and comparison means, wherein the memory stores at least one signal profile of the reception signal from the further electrode and an associated distance between the capacitive sensor and the further electrode, and wherein the comparison means compare the received reception signal with the stored reception signal in order to obtain an item of information relating to the distance between the capacitive sensor and the further electrode.

The distance information can be calibrated in this manner, and an item of information relating to the distance between the closing edges of the door or flap is available at any time during the closing of a door or flap.

In one development of the invention, the control unit has means for teaching in and storing a signal profile of the reception signal and the associated distance between the capacitive sensor and the further electrode.

Local conditions and boundary conditions can be taken into account by teaching in and storing the signal profile of the reception signal. For example, such teaching-in can be carried out in the case of a vehicle only after the vehicle has been completed and all special equipment has been installed. Within the scope of the invention, it is possible to repeatedly teach in and store the signal profile of the reception signal even during operation of a vehicle. This can be carried out as part of a function check and also need not necessarily be carried out over the entire movement area of the door or flap, but rather can also be carried out, for example, only in a critical movement area immediately before the definitive closing of the door or flap. A signal profile of the reception signal can also be taught in and stored regularly, for example, when opening a door or flap if there is no risk of a movable object, for example a human hand, getting caught.

In one development of the invention, the control unit has spatially distributed subcontrol units, wherein a subcontrol unit is respectively assigned to each capacitive sensor and/or to each reception electrode, and wherein the subcontrol units are each designed to generate a transmission signal, and wherein the subcontrol units are synchronized at least with respect to the generation of the transmission signals.

This makes it possible to implement short feed lines between the individual sensors and the control units. This is advantageous, in particular, in the case of large doors or flaps or, for example, when protecting the movement area of a robot arm. However, the important factor in such a case is that the subcontrol units are synchronized at least with respect to the generation of the transmission signals.

In one development of the invention, the subcontrol units are each provided with a serial interface for communicating with the other subcontrol units.

In a method for operating a sensor system for protecting movable objects, in particular motor-driven doors or flaps, having at least one capacitive sensor, having at least one control unit, wherein the control unit is designed to generate a transmission signal for the at least one capacitive sensor and to evaluate a first reception signal from the at least one capacitive sensor, and having a further electrode, wherein the at least one capacitive sensor and the at least one further electrode are movable relative to one another, the steps of evaluating a second reception signal from the at least one further electrode and deriving an item of information relating to the distance between the at least one capacitive sensor and the further electrode from the second reception signal are provided.

Deriving an item of information relating to the distance between the at least one capacitive sensor and the further electrode makes it possible to considerably improve the detection of objects since the signal change which is caused solely by the approach of the capacitive sensor and the further electrode can be compensated for by means of the distance information.

In one development of the invention, the formation of a differential signal from the first and second reception signals is provided.

Such a differential signal is substantially independent of the distance between the capacitive sensor and the further electrode, and the detection of an object can be considerably facilitated as a result.

In one development of the invention, the comparison of the second reception signal from the reception electrode with a stored profile of the second reception signal is provided, wherein a profile of the distance between the capacitive sensor and the reception electrode is assigned to the stored profile.

In one development of the invention, the storage of a profile of the second reception signal and the assigned distance by means of teaching-in is provided.

In one development of the invention, the application of the transmission signal to the further electrode and the evaluation of the first reception signal from the at least one capacitive sensor are provided.

The transmission signal emitted by the further electrode is received by the at least one capacitive sensor and an item of information relating to a distance between the further electrode and the at least one capacitive sensor can be obtained by evaluating said reception signal. The influence of the sensor signal can therefore be compared with the information relating to the distance. This makes it possible to compensate for the influence of objects equipped with an electrode in the region of the sensor. If two capacitive sensors are provided, a transmission signal can be simultaneously applied to both sensors. In such an operating mode, more sensitive detection of objects can be expected if both sensors are very close together. The influence of the reception signal from the sensors as a result of the approach of the sensors can be compensated for using the information relating to the distance between the two sensors. The distance information can be obtained either by means of time-division multiplexing or else by virtue of the fact that the transmission signals from the individual sensors each have a different frequency. It goes without saying that the control unit must then be able to evaluate all frequencies used.

In one development of the invention, the sensor system has at least two capacitive sensors, wherein the application of the transmission signal to the two capacitive sensors in temporal succession is provided.

In this manner, at least one capacitive sensor operates as a further electrode, whereas the other capacitive sensor(s) is/are then operated to detect objects.

In one development of the invention, the application of the transmission signal only to the first capacitive sensor, the application of the transmission signal only to the second capacitive sensor in temporal succession and the simultaneous application of the transmission signal to the at least two capacitive sensors are provided.

In this manner, the capacitive sensors are operated in temporal succession as a sensor for detecting objects and as a further electrode and are then simultaneously operated as sensors for detecting objects. A higher degree of sensitivity can be expected when simultaneously operating the at least two capacitive sensors for detecting objects. The different items of information obtained can be compared with one another and, as a result, can also be assessed, thus enabling considerably improved detection of objects.

Figure 2:
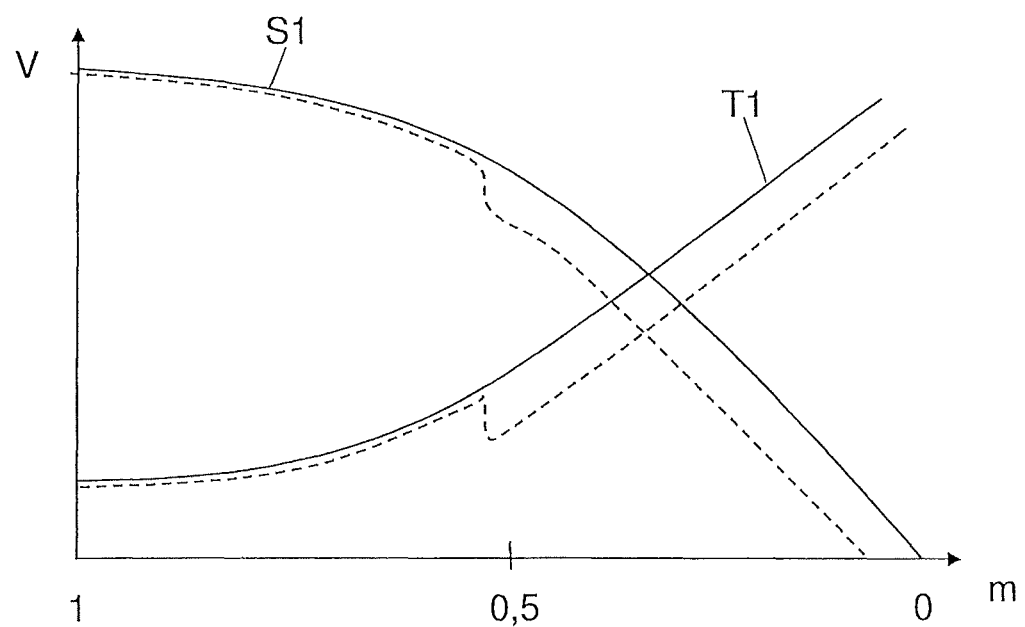
Figure 3:
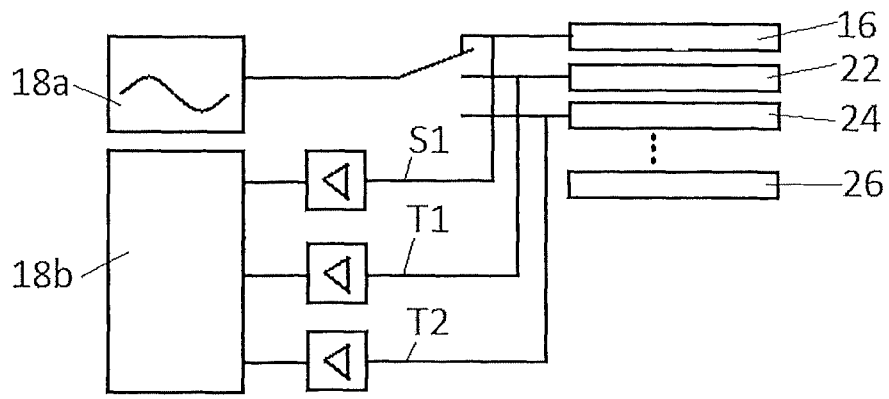
Figure 4:
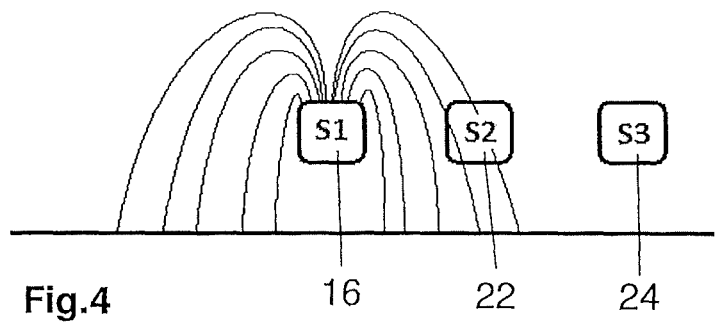
Figure 5:
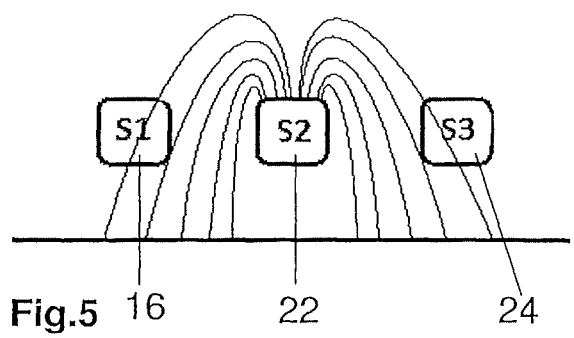
Figure 6:
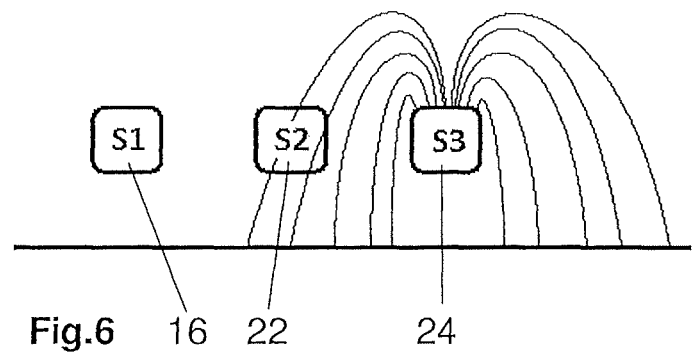
Figure 7:
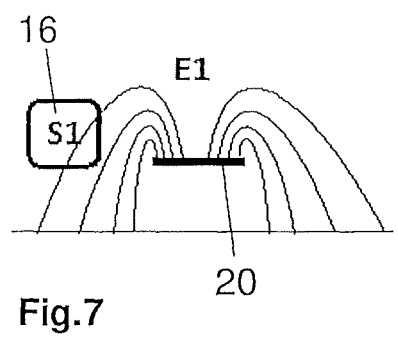
Figure 8:
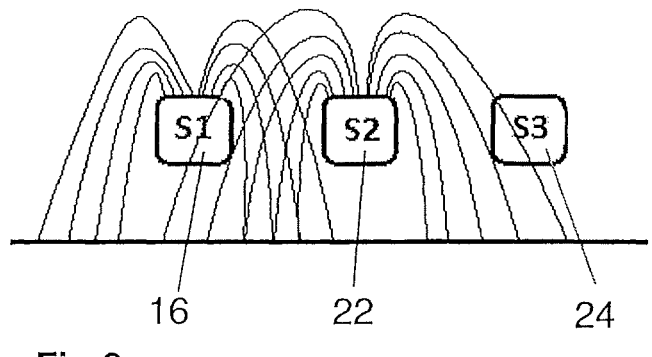
Figure 9:
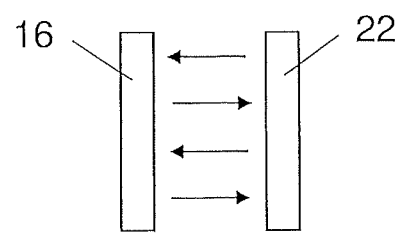
Figure 10:
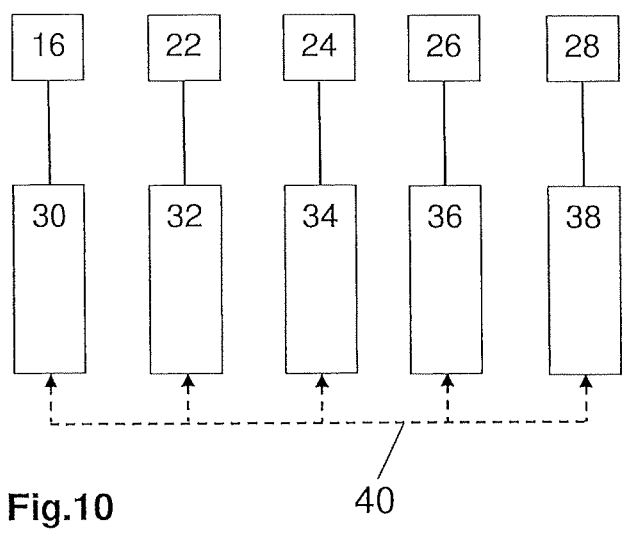
Figure 11:
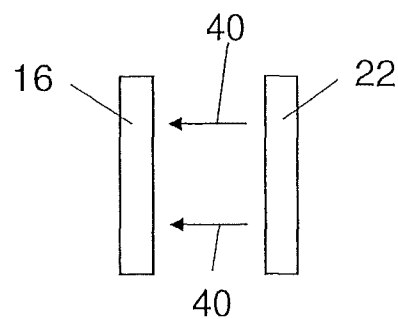
Figure 12:
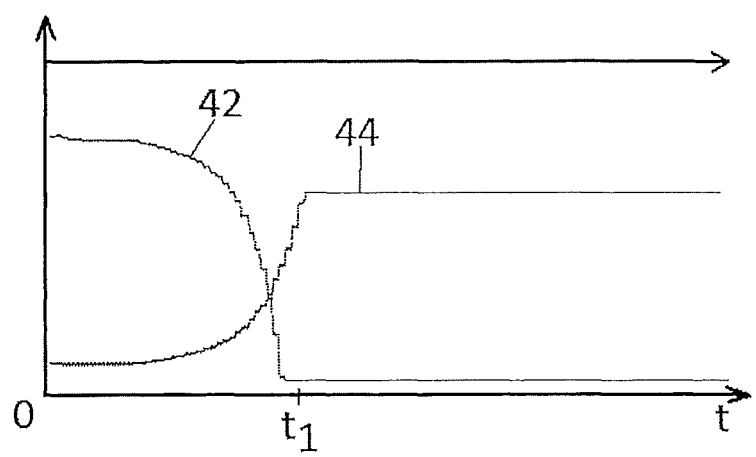
Figure 13:
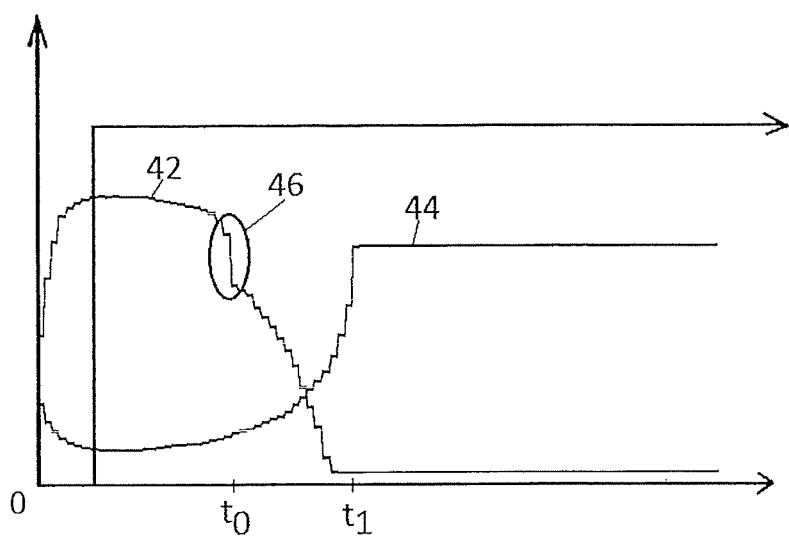

Further features and advantages of the invention emerge from the claims and the following description of preferred embodiments of the invention in connection with the drawings. Individual features of the different embodiments illustrated and described can be combined with one another in any desired manner in this case without exceeding the scope of the invention. In the drawings:

FIG. 1 shows a schematic illustration of a sensor system according to the invention in accordance with a first embodiment of the invention, FIG. 2 shows a schematic illustration of the signal profiles in the sensor system from FIG. 1, FIG. 3 shows a sensor system according to the invention in accordance with a further embodiment of the invention, FIG. 4 shows a schematic illustration of the field profile in a first operating phase of the sensor system from FIG. 3, FIG. 5 shows a schematic illustration of the field profile in a second operating phase of the sensor system from FIG. 3, FIG. 6 shows a schematic illustration of the field profile in a third operating phase of the sensor system from FIG. 3, FIG. 7 shows a schematic illustration of the field profile in an operating phase of the sensor system from FIG. 1, FIG. 8 shows a schematic illustration of the field profile during a further operating phase of the sensor system from FIG. 3, FIG. 9 shows a schematic illustration of two capacitive sensors, FIG. 10 shows a schematic illustration of a sensor system according to a further embodiment of the invention, FIG. 11 shows a schematic illustration of a sensor system according to a further embodiment of the invention, FIG. 12 shows a qualitative illustration of the reception signals from the sensor system from FIG. 11, and FIG. 13 shows a further qualitative illustration of the reception signals from the sensor system from FIG. 11.

The illustration in FIG. 1 schematically shows a sensor system according to the invention for protecting a motor-driven door 10, wherein the sensor system can generally be used to protect movable objects. The door 10 is pushed or folded across an opening 14 in the direction of the arrow 12 until the opening is then closed. Only sections of the door 10 are illustrated. A capacitive sensor 16 is arranged on a closing edge of the door 10 which is at the front in the closing direction 12. The sensor 16 is provided for the purpose of detecting a movable object, for example a human hand, inside the opening 14 when the door 10 is moving in the closing direction 12. A control unit applies a transmission signal to the capacitive sensor 16. A section 18a of the control unit is schematically illustrated and is used to generate the transmission signal.

A further section 18b of the control unit is likewise connected to the capacitive sensor 16 and is used to evaluate a reception signal output by the capacitive sensor 16. Depending on whether there is an object inside the field which is generated by means of the transmission signal and emanates from the capacitive sensor 16, for example a human hand, the reception signal output by the capacitive sensor 16 changes. In this manner, the capacitive sensor 16, in conjunction with the control unit 18a, 18b, can detect the presence of an object inside the opening 14. The basic method of operation of capacitive sensors which is described is well known to a person skilled in the art.

According to the invention, a further electrode 20 is arranged at a boundary of the opening 14 opposite the closing edge of the door 10. In principle, the reception electrode 20 has the same dimensions as the capacitive sensor 16, can form part of a capacitive sensor and extends substantially across the entire width of the opening 14. If a transmission signal is applied to the capacitive sensor 16, this transmission signal is received by the further electrode 20. Depending on the distance between the capacitive sensor 16 and the further electrode 20, the reception signal from the further electrode 20 changes. The reception signal is supplied from the further electrode 20 to the section 18b of the control unit and is evaluated. In this case, the evaluation can be carried out separately from the evaluation of the reception signal from the capacitive sensor 16. An item of information relating to the distance between the capacitive sensor 16 and the further electrode 20, in other words an item of information relating to the closing state of the door 10, can be derived by evaluating the reception signal from the further electrode 20. An item of distance information can also be obtained if, as provided for within the scope of the invention, a transmission signal is applied to the further electrode 20 and is received by the capacitive sensor 16 which is then switched to a passive state and itself does not simultaneously emit a signal at the frequency of the transmission signal from the further electrode 20, and the reception signal is then evaluated at the capacitive sensor 16 with regard to a distance between the further electrode 10 and the capacitive sensor 16.

FIG. 2 qualitatively shows the profile of the first reception signal S1 from the capacitive sensor 16 and of the second reception signal T1 from the further electrode 20. FIG. 2 qualitatively illustrates the signal S1 in volts against the decreasing distance in meters between the capacitive sensor 16 and the further electrode 20, see FIG. 1. It can be seen that the first reception signal S1 reduces its signal level with a decreasing distance between the capacitive sensor 16 and the further electrode 20. In other words, the signal level of the first reception signal S1 decreases when closing the door 10. The reduction in the signal level of the first reception signal S1 is caused by approaching the closing edge of the opening 14 that is at ground.

The profile of the second reception signal T1 is likewise qualitatively plotted in volts against the decreasing distance between the capacitive sensor 16 and the further electrode 20 using a solid line in FIG. 2. The signal level of the second reception signal T1 increases with decreasing distance between the capacitive sensor 16 and the further electrode 20.

The solid profile of the reception signals S1 and T1 corresponds to the profile of these two signals if no object to be detected is in the opening 14.

The profile of the two reception signals S1 and T1 which is illustrated using dashed lines corresponds to the signal profile when an object to be detected is in the opening 14. It can be seen that the two reception signals S1 and T1 suddenly decrease at the same time, using the example of a distance of somewhat more than 0.5 m between the capacitive sensor 16 and the further electrode 20.

After this sudden decrease, the first reception signal S1 then runs in a substantially horizontal manner in order to then conform again to the profile of the first reception signal S1 without the presence of an object, that is to say to the solid profile of the first reception signal S1 in FIG. 2. The first reception signal S1 consequently reacts to the presence of an object, which indeed constitutes an additional connection to ground, with a considerable signal drop. During regular operation of the sensor system, this signal drop is then used to stop or reverse the motor-driven door 10. If the door 10 continues to move even after the detection of an object, as is illustrated for the purpose of illustrating the method of operation in FIG. 2, the signal change caused by the object remains in the reception signal S1.

In the case of the second reception signal T1 from the further electrode 20, the presence of an object results in a considerable signal drop simultaneously with the first reception signal. Since the object to be detected constitutes an additional connection to ground, the signal level of the second reception signal T1 is reduced. If, despite the presence of an object, which does not correspond to regular operation, as stated, the door 10 is then closed further, the second reception signal T1 increases again according to the dashed profile in FIG. 2, but the signal level remains lower than in the case illustrated using solid lines without an object to be detected on account of the object which is still present.

It can therefore be immediately determined, on the basis of the solid and dashed signal profile of the second reception signal T1, that an item of distance information obtained from the second reception signal T1 is distorted when an object to be detected is present. However, this is not important for the operation of the sensor system since, as likewise already stated, the door 10 is stopped or reversed anyway during regular practical operation after an object has been detected as a result of the sudden signal drop in the first reception signal S1. As soon as an object is therefore detected by means of the capacitive sensor 16, the distance information obtained from the second reception signal T1 is no longer important since the door is stopped or reversed anyway.

After the object has been removed from the movement path of the door 10 again, the distance information from the second reception signal T1 is also no longer distorted since said reception signal then again follows the solid profile.

A differential signal can be calculated from the two reception signals S1 and T1. When generating the reception signal, the first reception signal S1 and/or the second reception signal T1 can possibly be weighted. The differential signal formed is then substantially independent of a closing position of the door 10, in other words independent of a distance between the capacitive sensor 16 and the further electrode 20. This has the considerable advantage that objects in the gap between the opening and the door can still be detected even immediately before the definitive closing of the door 10, that is to say shortly before the capacitive sensor 16 strikes the reception electrode 20.

It can be gathered from FIG. 2 that this is already no longer possible shortly before the definitive closing of the door with the aid of the first reception signal S1 since the signal level of the first reception signal S1 is already close to zero shortly before the definitive closing of the door. In contrast, the differential signal which is substantially independent of the closing state of the door still allows objects inside the opening 14 to be detected even shortly before the definitive closing of the door 10. As a result, improved detection of objects can be achieved with the sensor system according to the invention.

FIG. 3 shows a schematic illustration of a further sensor system according to the invention for detecting or protecting movable objects. The sensor system has a plurality of capacitive sensors 16, 22, 24 and 26, wherein the number of capacitive sensors is not limited, which is indicated by three dots between the two sensors 24 and 26. A transmission signal which is generated by the section 18a of a control unit can be applied to the capacitive sensors 16, 22, 24, 26 in succession. It can be gathered from FIG. 3 that the transmission signal from the section 18a can only ever be applied to one of the sensors 16, 22, 24, 26. For example, the transmission signal can be applied to the sensors 16, 22, 24, 26 in succession in the manner of time-division multiplexing.

A reception signal from the capacitive sensors 16, 22, 24, 26 is respectively amplified and is supplied to the section 18b of the control unit, where evaluation is carried out.

In the illustrated state of the sensor system in FIG. 3, the transmission signal is applied to the capacitive sensor 16 and the capacitive sensor 16 forwards the first reception signal S1 to the section 18b.

In the illustrated state of the system in FIG. 3, the transmission signal is not applied to the second capacitive sensor 22 and the latter is consequently passive. In the illustrated state in FIG. 3, the second capacitive sensor 22 therefore operates as a further electrode and forwards the second reception signal T1 to the section 18b of the control unit. As already explained on the basis of FIG. 1, an item of information relating to the distance between the two sensors 16 and 22 can be obtained from the second reception signal T1.

In the state in FIG. 3, a transmission signal is also not applied to the third capacitive sensor 24 and the latter is consequently passive. The third capacitive sensor 24 consequently forwards a third reception signal to the section 18b, which third reception signal is denoted T2 and can likewise be evaluated in order to obtain an item of information relating to the distance between the sensors 16 and 24.

In the same manner, all further sensors, for example the sensor 26, are passive in the state in FIG. 3. The further sensors consequently likewise forward a reception signal to the section 18b and these further reception signals can be used to determine a distance between the further sensors and the first capacitive sensor 16. For the sake of clarity, the connections between the sensor 26 and the sections 18a, 18b of the control unit are not illustrated in FIG. 3.

In the state in FIG. 3, an obstacle can therefore be detected in the movement area of a movable object, in particular a door or flap, by means of the first reception signal S1 from the first capacitive sensor 16. The second reception signal T1 from the second capacitive sensor 22 is used to obtain an item of information relating to the distance between the two capacitive sensors 16, 22 in the state in FIG. 3.

In the same manner, the third reception signal T2 from the third capacitive sensor 24 is used to obtain an item of information relating to the distance between the two capacitive sensors 16, 24 in the state in FIG. 3. The signal from the further capacitive sensors, for example the capacitive sensor 26, is evaluated in the same manner.

If, starting from the state in FIG. 3, the transmission signal from the section 18a is applied to the second capacitive sensor 22, the reception signal from the second capacitive sensor 22 is used to detect an obstacle. In contrast, the reception signal from the first capacitive sensor 16 and from the further capacitive sensors 24, 26 is then used to obtain an item of information relating to the distance between the second capacitive sensor 22 and the first capacitive sensor 16 or the further capacitive sensors 24, 26.

Consequently, starting from the state in FIG. 3, the transmission signal from the section 18a of the control unit is only ever applied to one of the capacitive sensors 16, 22, 24, 26. Only the reception signal from this one capacitive sensor is then used to detect obstacles. The reception signals from the other capacitive sensors are likewise evaluated but are used only to obtain an item of information relating to the distance between the capacitive sensor, to which a transmission signal is currently applied, and the other capacitive sensors.

The illustration in FIG. 4 shows a schematic illustration of the electrical field generated in the state in FIG. 3. As stated, a transmission signal is applied only to the first capacitive sensor 16. In contrast, the further capacitive sensors 22, 24 are switched to a passive state and themselves do not generate an electrical field. On the basis of the illustration of the field lines emanating from the capacitive sensor 16, it can also easily be seen that the reception signal present at the capacitive sensors 22, 24 becomes greater, the shorter the distance between the first capacitive sensor 16 and the second or third capacitive sensor 22, 24.

FIG. 5 schematically illustrates the profile of the electrical field when the transmission signal is applied to the second capacitive sensor 22. In this state, the first capacitive sensor 16 and the third capacitive sensor 24 are switched to a passive state and themselves do not generate an electrical field.

FIG. 6 shows the state in which the transmission signal is applied only to the third capacitive sensor 24. The two other capacitive sensors 16, 22 are switched to a passive state in this case and consequently themselves do not generate an electrical field.

The illustration in FIG. 7 schematically shows a sensor system which corresponds substantially to the sensor system in FIG. 1. The first capacitive sensor 16 and the further electrode 20 are provided. However, a transmission signal is now occasionally applied to the further electrode 20 and, as a result, the latter generates an electrical field, whereas the first capacitive sensor 16 is switched to a passive state when a transmission signal is applied to the further electrode 20. The signal emitted by the further electrode 20 can consequently be received by the capacitive sensor 16 in order to obtain an item of information therefrom relating to a distance between the further electrode 20 and the first capacitive sensor 16.

FIG. 7 therefore schematically illustrates an alternative method of operation in which the further electrode 20 operates as a transmission electrode occasionally or in the case of a different frequency or modulation and the capacitive sensor 16 operates as a further electrode. The method of operation explained on the basis of FIG. 7 can be alternately carried out with the method of operation explained on the basis of FIG. 1, for example, in order to check the function of the sensor system.

FIG. 8 schematically illustrates a sensor system having three capacitive sensors 16, 22, 24. However, in contrast to the sensor system in FIG. 3, a transmission signal is simultaneously applied to the capacitive sensors 16 and 22. Only the third capacitive sensor 24 is switched to a passive state. If a transmission signal is simultaneously applied to the two capacitive sensors 16, 22, more sensitive detection of obstacles can be expected if the two capacitive sensors 16 and 22 are very close together. In order to facilitate or actually enable the evaluation of the reception signals from the two capacitive sensors 16 and 22, these reception signals are compensated for, however, using the reception signal from the capacitive sensor 24 which has been switched to a passive state. The reception signals from the two capacitive sensors 16 and 22, to which a transmission signal has been applied, are then substantially independent of the distance between the two sensors 16, 22 and it is possible to detect obstacles even in the case of a very short distance between the two sensors 16, 22.

It goes without saying that a transmission signal can be applied to only one of the capacitive sensors 16, 22, 24 in succession and then to two of the sensors 16, 22, 24 in each case in order to enable yet further improved detection of obstacles and greater operational reliability.

FIG. 9 schematically shows two capacitive sensors 16, 22 which are movable relative to one another and in which, as explained on the basis of FIG. 3, a transmission signal is alternately applied to the capacitive sensors 16, 22 or the capacitive sensors are switched to a passive state in order to obtain an item of distance information. Such alternating operation results in redundant signals and therefore in increased failure safety of the sensor system. A function check of the two capacitive sensors 16, 22 and of the associated control unit is also possible.

As an alternative to the methods of operation already discussed, a plurality of capacitive sensors 16, 22, 24, 26 can also be used, wherein a transmission signal at a different frequency in each case is applied to each of the capacitive sensors 16, 22, 24, 26 at the same time. Each of the capacitive sensors 16, 22, 24, 26 must then be assigned a control unit which can simultaneously evaluate reception signals at all frequencies used as transmission signals. As a result, it is possible to detect objects using each of the capacitive sensors 16, 22, 24, 26 at the same time and also to obtain an item of information relating to the distance between the respective sensor and the other sensors.

In the case of such a method of operation, it is also possible, inter alia, to permanently monitor the functionality of the sensor system.

FIG. 10 shows a sensor system according to a further embodiment of the invention. Capacitive sensors 16, 22, 24, 26 and 28 are provided. A separate control unit 30, 32, 34, 36, 38 is assigned to each of the capacitive sensors 26 to 28. The control units 30, 32, 34, 36, 38 apply a transmission signal to each of the capacitive sensors 16, 22, 24, 26, 28 and also evaluate the respective reception signal from the capacitive sensors 16, 22, 24, 26, 28. The control units 30 to 38 are also designed to occasionally switch the capacitive sensors 16 to 28 to a passive state, that is to say to not apply a transmission signal to said sensors, and to then obtain the respective distance signal in order to obtain an item of information relating to the distance between the capacitive sensors 16 to 28.

Alternatively, the control units 30 to 38 are suitable for generating transmission signals at a different frequency and evaluating reception signals at different frequencies, as already explained above. The assignment of a respective control unit 30 to 38 to one of the capacitive sensors 16 to 28 also facilitates the spatially remote installation of capacitive sensors, for example when protecting very large doors or flaps. However, the important factor is that the control units 30 to 38 are synchronized with one another. This can be carried out by means of a synchronization line 40 depicted using dashed lines in FIG. 10 or alternatively in a wireless manner using a radio signal.

According to one further embodiment of the invention, it is possible to dispense with synchronization of the control units 30 to 38 and the synchronization line 40 depicted using dashed lines in FIG. 10 can then consequently be omitted if the frequencies of the respective other control units are known to each control unit 30 to 38. For example, all control units 30 to 38 operate at different frequencies when generating a transmission signal for the respectively associated sensor and when evaluating the reception signal from the respective sensor. The frequencies at which the control units 32 to 38 operate are then known to the control unit 30, the frequencies at which the control units 30, 34, 36, 38 operate are known to the control unit 32, the frequencies at which the control units 30, 32, 36, 38 operate are known to the control unit 34, the frequencies at which the control units 30, 32, 34, 38 operate are known to the control unit 36 and the frequencies at which the control units 30 to 36 operate are known to the control unit 38. The signal from each adjacent sensor can then be received and evaluated by filtering the signal in the control units 30 to 38. An item of information relating to the distance between the sensors 16 to 28 is then available again on the basis of this signal. The signal from the separate sensor can then be compensated for using this signal. For example, the control unit 30 evaluates the signal from the sensors 22 to 28 and compensates for the signal from the associated sensor 16 using this signal.

FIG. 11 schematically shows the sensor system from FIG. 9 with the two capacitive sensors 16 and 22. The two sensors 16, 22 are movable relative to one another. In contrast to the method of operation explained on the basis of FIG. 9, only the capacitive sensor 22, which is illustrated on the right in FIG. 11, emits a transmission signal which is indicated by means of the arrows 40.

FIG. 12 qualitatively shows the signal profile of the reception signals at the two capacitive sensors 16, 22 if the two capacitive sensors 16, 22 are moved toward one another. FIG. 12 shows the signal profile without the presence of an object.

FIG. 13 likewise shows the signal profile of the reception signals at the two capacitive sensors 16, 22, wherein an object is situated between the two capacitive sensors 16, 22 in the case of FIG. 13.

In FIG. 12, the curve 42 shows the signal profile at the capacitive sensor 22, from which the transmission signal 40 therefore emanates. It can be clearly seen in FIG. 12 that the signal level of the reception signal at the capacitive sensor 22 decreases with decreasing distance between the two capacitive sensors 16, 22. This is caused by the capacitive sensor 22 approaching sections of a closing opening and/or of a fastening of the first capacitive sensor 16 which are at ground.

In contrast, the reception signal 44 which is measured at the capacitive sensor 16 increases with the decreasing distance between the two sensors. The closer the two capacitive sensors 16, 22 come to one another, the greater the influence of the transmission signal 40 on the reception signal at the capacitive sensor 16.

At a time ti, the distance between the two capacitive sensors 16, 22 is approximately zero.

FIG. 13 shows the two signals 42, 44, which have already been explained on the basis of FIG. 12, when an object is present between the two capacitive sensors 16, 22.

At the time to, an object arrives between the two capacitive sensors 16, 22, for example a human hand. This produces a signal drop 46 in the reception signal 42 from the capacitive sensor 22, which signal drop is encircled with a dashed line in FIG. 13. As a rule, this sudden signal drop is used to detect the object and then results in the movement of the two capacitive sensors 16, 22 toward one another being stopped or reversed. For the purpose of illustration, the two capacitive sensors 16, 22 were moved further toward one another despite the presence of the object according to the signal profile in FIG. 13. It can be seen that the signal change caused by the object at 46, that is to say an offset in the direction of zero, is retained in the further profile of the approach of the two capacitive sensors 16, 22 and therefore in the further profile of the signal 42.

The influence on the reception signal 44 at the capacitive sensor 16 by the object is less than the influence on the reception signal 42 at the capacitive sensor 22. However, in comparison with the profile in FIG. 12, it is possible to observe a signal drop which then likewise remains in the further profile of the approach.

The invention claimed is:

1. A sensor system for protecting movable objects comprising at least one capacitive sensor and at least one control unit, wherein the at least one control unit is designed to generate a transmission signal for the at least one capacitive sensor and to evaluate a first reception signal from the at least one capacitive sensor, further including at least one further electrode which is separate from the at least one capacitive sensor and that is connected to the at least one control unit, wherein the at least one capacitive sensor and the at least one further electrode are movable relative to one another, and further including means for generating a transmission signal for the at least one further electrode and/or means for evaluating a second reception signal from the at least one further electrode.

2. The sensor system according to claim 1, wherein the at least one control unit has the means for evaluating the second reception signal from the at least one further electrode, and wherein the evaluation means are designed to derive an item of information relating to a distance between the at least one capacitive sensor and the at least one further electrode from the second reception signal.

3. The sensor system according to claim 1, wherein the at least one control unit is designed to calculate a differential signal, wherein the differential signal is formed from a possibly weighted first reception signal from the at least one capacitive sensor and a possibly weighted second reception signal from the at least one further electrode.

4. The sensor system according to claim 1, wherein the at least one further electrode forms part of a further capacitive sensor.

5. The sensor system according to claim 1, wherein the at least one capacitive sensor is at least two capacitive sensors, wherein the at least one control unit is designed to apply the transmission signal to the at least two capacitive sensors in temporal succession.

6. The sensor system according to claim 1, wherein the at least one capacitive sensor is at least two capacitive sensors, wherein the at least one control unit is designed to generate the transmission signal at a different frequency for each capacitive sensor.

7. The sensor system according to claim 1, wherein the control unit has a memory and a comparison means, wherein the memory stores at least one signal profile of the second reception signal from the at least one further electrode and an associated distance between the at least one capacitive sensor and the at least one further electrode, and wherein the comparison means compare at least once received profile of the reception signal with the at least one signal profile stored in the memory in order to obtain an item of information relating to a distance between the at least one capacitive sensor and the at least one further electrode.

8. The sensor system according to claim 7, wherein the at least one control unit has means for teaching in and storing a signal profile of the reception signal and an associated distance between the at least one capacitive sensor and the at least one reception electrode.

9. The sensor system according to claim 1, wherein the at least one control unit has spatially distributed subcontrol units, wherein each one of the subcontrol units is respectively assigned to each at least one capacitive sensor and/or to each at least one further electrode, and wherein the subcontrol units are each designed to generate the transmission signal, and wherein the subcontrol units are synchronized at least with respect to generation of the transmission signals.

10. The sensor system according to claim 9, wherein each of the subcontrol units include a serial interface for communicating with each other.

11. The sensor system according to claim 1, further including a wired connection between the at least one capacitive sensor and the at least one control unit, wherein the wired connection carries the transmission signal between the at least one capacitive sensor and the least one control unit.

12. The sensor system according to claim 1, further including a wired connection between the at least one further electrode and the at least one control unit, wherein the wired connection carries the transmission signal from the at least one further electrode to the at least one control unit.

13. A method for operating a sensor system for protecting movable objects comprising at least one capacitive sensor and at least one control unit, wherein the at least one control unit is designed to generate a transmission signal for the at least one capacitive sensor and to evaluate a first reception signal from the at least one capacitive sensor, and having at least one further electrode which is connected to the at least once control unit, wherein the at least one capacitive sensor and the at least one further electrode are movable relative to one another, having the steps of evaluating a second reception signal from the at least one further electrode and/or generating a transmission signal for the at least one further electrode.

14. The method according to claim 13, including derivating an item of information relating to a distance between the at least one capacitive sensor and the at least one further electrode from the second reception signal.

15. The method according to claim 13, including forming a differential signal from the first and second reception signals.

16. The method according to claim 13, including comparing the second reception signal from the at least one further electrode with a stored profile of the second reception signal, wherein a profile of a distance between the at least one capacitive sensor and the at least one further electrode is assigned to the stored profile.

17. The method according to claim 16, including storing a profile of the second reception signal and the distance by means of teaching-in.

18. The method according to claim 13, including applying the transmission signal to the at least one further electrode and evaluating the first reception signal from the at least one capacitive sensor.

19. The method according to claim 13, wherein the at least one capacitive sensor is at least two capacitive sensors, and the method includes applying the transmission signal to the at least two capacitive sensors in temporal succession.

20. The method according to claim 19, including applying the transmission signal only to a first one of the at least two capacitive sensors, applying the transmission signal only to a second one of the at least two capacitive sensors in temporal succession and simultaneously applying the transmission signal to the at least two capacitive sensors.

21. A sensor system for protecting movable objects comprising:
at least one capacitive sensor and at least one control unit, the control unit generating a transmission signal for the at least one capacitive sensor and evaluating a first reception signal from the at least one capacitive sensor;
a wired connection between the at least one control unit and the at least one capacitive sensor, wherein the wired connection carries the transmission signal between the least one control unit and the at least one capacitive sensor;
at least one further electrode which is separate from the sensor connected to the control unit, wherein the at least one capacitive sensor and the at least one further electrode are movable relative to one another; and
means for generating a transmission signal for the at least one further electrode and/or means for evaluating a second reception signal from the at least one further electrode.

* * * * *